United States Patent
Ji et al.

(10) Patent No.: US 10,714,654 B2
(45) Date of Patent: Jul. 14, 2020

(54) SOLAR CELL AND METHOD FOR MANUFACTURING THE SAME

(71) Applicant: LG ELECTRONICS INC., Seoul (KR)

(72) Inventors: Kwangsun Ji, Seoul (KR); Jin-won Chung, Seoul (KR); Yujin Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/250,694

(22) Filed: Jan. 17, 2019

(65) Prior Publication Data

US 2019/0157496 A1 May 23, 2019

Related U.S. Application Data

(62) Division of application No. 14/931,591, filed on Nov. 3, 2015, now Pat. No. 10,224,453.

(30) Foreign Application Priority Data

Nov. 4, 2014 (KR) ........................ 10-2014-0152372

(51) Int. Cl.
*H01L 31/18* (2006.01)
*H01L 31/0216* (2014.01)
*H01L 31/0745* (2012.01)

(52) U.S. Cl.
CPC .... *H01L 31/1872* (2013.01); *H01L 31/02167* (2013.01); *H01L 31/0745* (2013.01); *H01L 31/182* (2013.01); *H01L 31/1804* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| 5,486,237 A | 1/1996 | Sano et al. |
| 5,529,937 A | 6/1996 | Zhang et al. |
| 2005/0189015 A1* | 9/2005 | Rohatgi .......... H01L 31/022425 136/261 |
| 2007/0023081 A1* | 2/2007 | Johnson .............. H01L 31/065 136/258 |

(Continued)

FOREIGN PATENT DOCUMENTS

| EP | 1843398 A2 | 10/2007 |
| EP | 2642525 A2 | 9/2013 |

(Continued)

*Primary Examiner* — Shaun M Campbell
(74) *Attorney, Agent, or Firm* — Birch, Stewart, Kolasch & Birch, LLP

(57) ABSTRACT

A solar cell includes a semiconductor substrate containing impurities of a first conductive type; a tunnel layer positioned on the semiconductor substrate; an emitter region positioned on the tunnel layer and containing impurities of a second conductive type opposite the first conductive type; a dopant layer positioned on the emitter region and formed of a dielectric material containing impurities of the second conductive type; a first electrode connected to the semiconductor substrate; and a second electrode configured to pass through the dopant layer, and connected to the emitter region.

5 Claims, 10 Drawing Sheets

(56) References Cited

U.S. PATENT DOCUMENTS

| | | |
|---|---|---|
| 2009/0205712 A1* | 8/2009 | Cousins .............. H01L 31/0745 |
| | | 136/261 |
| 2009/0269913 A1* | 10/2009 | Terry ................ H01L 21/02532 |
| | | 438/558 |
| 2009/0308438 A1 | 12/2009 | De Ceuster et al. |
| 2010/0154876 A1* | 6/2010 | Camalleri ............ H01L 31/182 |
| | | 136/255 |
| 2011/0056544 A1* | 3/2011 | Ji ......................... H01L 31/028 |
| | | 136/255 |
| 2012/0073650 A1 | 3/2012 | Smith et al. |
| 2013/0228221 A1* | 9/2013 | Moslehi .......... H01L 31/022441 |
| | | 136/256 |
| 2013/0240031 A1 | 9/2013 | Shim et al. |
| 2013/0247965 A1 | 9/2013 | Swanson et al. |
| 2014/0209166 A1 | 7/2014 | Krokoszinski et al. |
| 2014/0251423 A1 | 9/2014 | Lee et al. |
| 2016/0197209 A1 | 7/2016 | Jin et al. |

FOREIGN PATENT DOCUMENTS

| | | |
|---|---|---|
| EP | 2654090 A2 | 10/2013 |
| JP | 2003-282458 A | 10/2003 |
| JP | 2008-21993 A | 1/2008 |
| JP | 2009-503848 A | 1/2009 |
| JP | 2011-61197 A | 3/2011 |
| JP | 2011-512661 A | 4/2011 |
| JP | 2011-512689 A | 4/2011 |
| JP | 2013-197587 A | 9/2013 |
| JP | 2013-222961 A | 10/2013 |
| JP | 2013-538009 A | 10/2013 |

* cited by examiner

SOLAR CELL AND METHOD FOR MANUFACTURING THE SAME

CROSS-REFERENCE TO RELATED APPLICATION

This application is a Divisional of U.S. patent application Ser. No. 14/931,591, filed on Nov. 3, 2015, which claims priority to and the benefit of Korean Patent Application No. 10-2014-0152372 filed in the Korean Intellectual Property Office on Nov. 4, 2014, the entire contents of all of these applications are incorporated herein by reference into the present application.

BACKGROUND OF THE INVENTION

Field of the Invention

The present disclosure relates to a solar cell and a method for manufacturing the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

In one aspect, there is a solar cell including a semiconductor substrate containing impurities of a first conductive type, a tunnel layer positioned on the semiconductor substrate, an emitter region positioned on the tunnel layer and containing impurities of a second conductive type opposite the first conductive type, a dopant layer positioned on the emitter region and formed of a dielectric material containing impurities of the second conductive type, a first electrode connected to the semiconductor substrate, and a second electrode configured to pass through the dopant layer, and connected to the emitter region.

A doping concentration of the second conductive type impurities contained in the emitter region in a first portion of the emitter region contacting the second electrode may be higher than the doping concentration in a second portion of the emitter region contacting the tunnel layer.

A doping concentration of the second conductive type impurities contained in the emitter region may increase in the emitter region in going away from the tunnel layer.

More specifically, a first doping concentration of the second conductive type impurities in the first portion of the emitter region contacting the second electrode may be higher than a second doping concentration of the second conductive type impurities in the second portion of the emitter region contacting the tunnel layer.

For example, the first doping concentration may be $5*10^{19}/cm^3$ to $5*10^{21}/cm^3$, and the second doping concentration may be $5*10^{18}/cm^3$ to $5*10^{20}/cm^3$.

The doping concentration of the emitter region may successively decrease linearly or nonlinearly in the emitter region in going from the first portion to the second portion.

The emitter region may be formed of a polycrystalline silicon material. A crystallinity of the emitter region may increase in the emitter region in going away from the tunnel layer.

A thickness of the emitter region may be 50 nm to 150 nm, and a thickness of the dopant layer may be 25 nm to 150 nm.

The solar cell may further include a hydrogen injection layer positioned on a back surface of the dopant layer and formed of a dielectric material containing hydrogen at a higher concentration than that of the dopant layer.

The solar cell may further include a front surface field region positioned on a front surface of the semiconductor substrate and containing impurities of the first conductive type at a higher concentration than that of the semiconductor substrate. The tunnel layer, the emitter region, and the dopant layer may be positioned on a back surface of the semiconductor substrate.

In another aspect, there is a method for manufacturing a solar cell, the method including a layer forming operation of sequentially forming a tunnel layer, an intrinsic amorphous silicon layer, and a dopant layer on a back surface of a semiconductor substrate formed of a crystalline silicon material containing impurities of a first conductive type, the dopant layer being formed of a dielectric material containing impurities of a second conductive type opposite the first conductive type; a thermal processing operation of, after the layer forming operation, forming a front surface field region on a front surface of the semiconductor substrate through one successive thermal process, in which a temperature in a furnace is maintained or raised, recrystallizing the intrinsic amorphous silicon layer into an intrinsic polycrystalline silicon layer, and diffusing and activating the impurities of the second conductive type of the dopant layer into the recrystallized intrinsic polycrystalline silicon layer to form an emitter region; and an electrode forming operation of, after the thermal processing operation, forming a first electrode connected to the front surface of the semiconductor substrate and forming a second electrode connected to the emitter region.

The layer forming operation may further include a process for forming a capping layer formed of a dielectric material not containing impurities of the second conductive type on a back surface of the dopant layer.

The method may further include, between the thermal processing operation and the electrode forming operation, an operation of removing a capping layer formed on the back surface of the semiconductor substrate and an oxide layer formed on a front surface of the front surface field region in the thermal processing operation; and an operation of forming a hydrogen injection layer formed of a dielectric layer containing hydrogen on the back surface of the dopant layer, on which the capping layer is removed.

The forming of the emitter region may include a dehydrogenation process for removing hydrogen contained in the intrinsic amorphous silicon layer; a recrystallization process for recrystallizing the intrinsic amorphous silicon layer into the intrinsic polycrystalline silicon layer; and an emitter region activating process for diffusing and activating the impurities of the second conductive type contained in the dopant layer into the recrystallized intrinsic polycrystalline silicon layer.

The forming of the front surface field region may include a front surface field region activating process for diffusing and activating impurities of the first conductive type into the front surface of the semiconductor substrate. The front surface field region activating process may be performed along with the emitter region activating process.

The thermal processing operation may include a first thermal process for maintaining the temperature of the furnace at a first temperature, a second thermal process for changing the temperature of the furnace from the first temperature to a second temperature higher than the first temperature, a third thermal process for maintaining the temperature of the furnace at the second temperature, a fourth thermal process for changing the temperature of the furnace from the second temperature to a third temperature higher than the second temperature, and a fifth thermal process for maintaining the temperature of the furnace at the third temperature.

The first to fifth thermal processes may be successively performed in the same furnace.

A second thermal process time of the second thermal process may be longer than a first thermal process time of the first thermal process and a third thermal process time of the third thermal process. The third thermal process time may be equal to or longer than the first thermal process time.

For example, the first thermal process may maintain the temperature of the furnace at the first temperature of 350° C. to 450° C. for 5 minutes to 15 minutes. The third thermal process may maintain the temperature of the furnace at the second temperature of 500° C. to 600° C. for 10 minutes to 20 minutes.

The second thermal process may increase the temperature of the furnace from the first temperature to the second temperature for 15 minutes to 25 minutes.

The fifth thermal process may maintain the temperature of the furnace at the third temperature of 800° C. to 1000° C. for 15 minutes to 30 minutes. The fourth thermal process may increase the temperature of the furnace from the second temperature to the third temperature for 5 minutes to 15 minutes.

The dehydrogenation process may be performed through the first to third thermal processes. The recrystallization process may be performed through the fourth thermal process.

The emitter region activating process and the front surface field region activating process may be performed through the fifth thermal process.

The solar cell and the method for manufacturing the same according to the present disclosure are configured so that the doping concentration of impurities of the second conductive type contained in the emitter region increases as the emitter region is far away from the tunnel layer. Hence, a recombination of carriers in the emitter region can be reduced, and contact characteristic between the emitter region and the second electrode can be further improved.

Furthermore, the method for manufacturing the solar cell according to the present disclosure simultaneously forms the front surface field region and the emitter region through one successive thermal process, of which a temperature is maintained or raised, and thus can further reduce manufacturing time.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
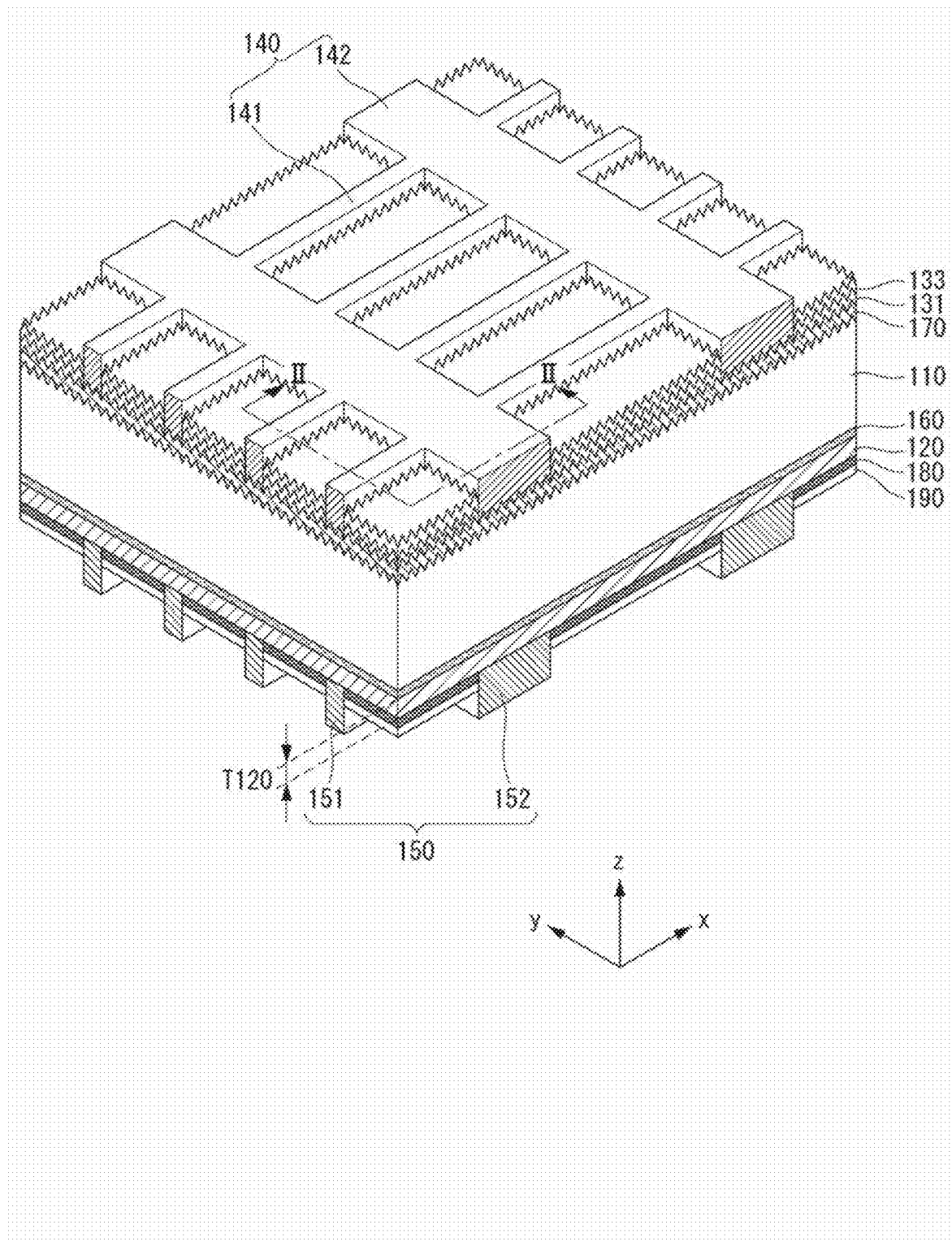
FIGS. 1 and 2 illustrate a solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, a "front surface" may be one surface of a semiconductor substrate, on which light is directly incident, and a "back surface" may be a surface opposite the one surface of the semiconductor substrate, on which light is not directly incident or reflective light may be incident.

Exemplary embodiments of the invention are described with reference to FIGS. 1 to 7.

Figure 2:
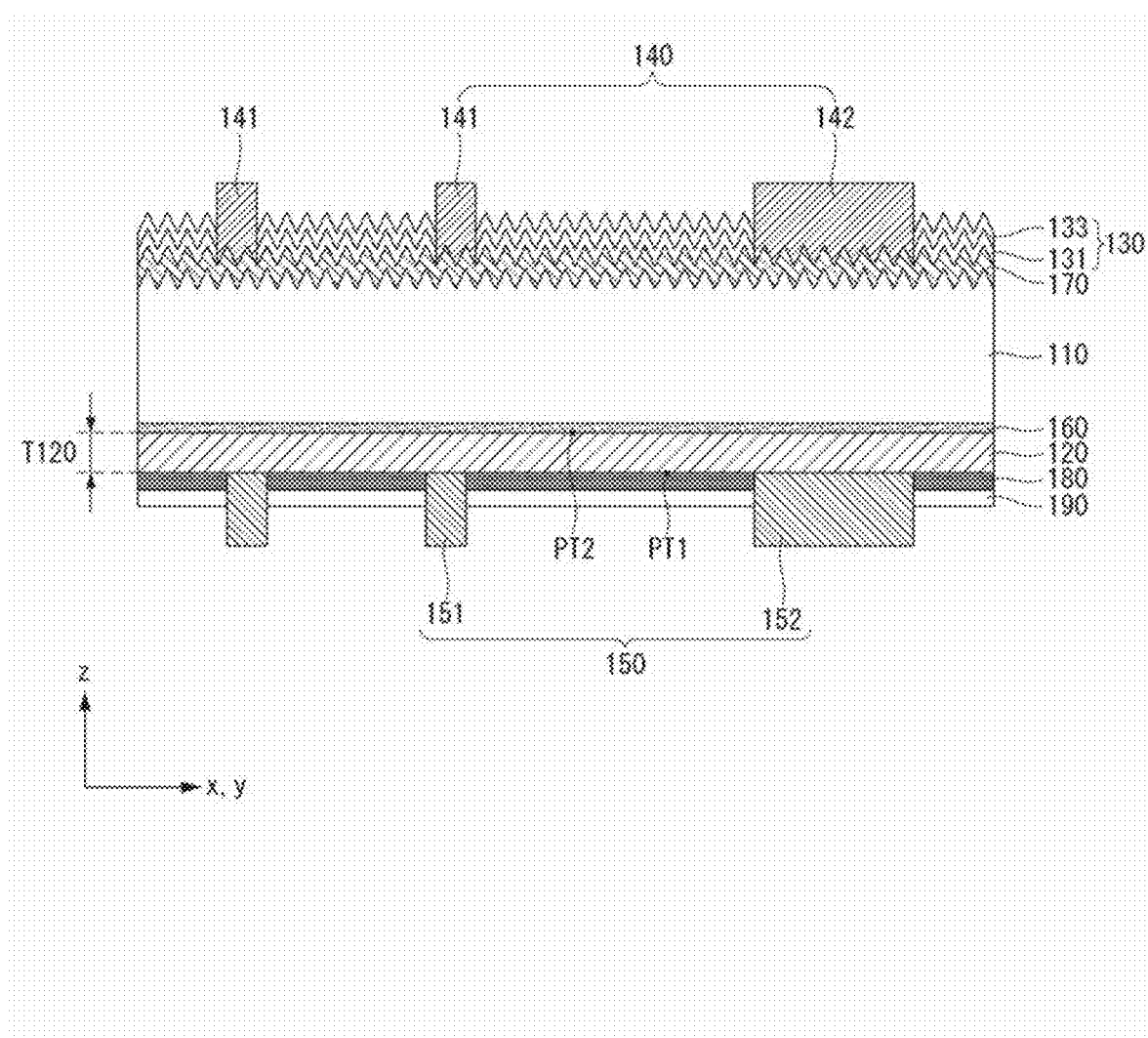

FIGS. 1 and 2 illustrate a solar cell according to an example embodiment of the invention. More specifically, FIG. 1 is a partial perspective view of the solar cell according to the embodiment of the invention, and FIG. 2 is a cross-sectional view taken along line II-II of FIG. 1.

As shown in FIGS. 1 and 2, a solar cell according to the embodiment of the invention may include a semiconductor substrate 110, a tunnel layer 160, an emitter region 120, a dopant layer 180, a hydrogen injection layer 190, a front surface field region 170, a passivation layer 131, an anti-reflection layer 133, a first electrode 140, and a second electrode 150.

In the embodiment disclosed herein, the anti-reflection layer 133, the passivation layer 131, and the hydrogen injection layer 190 may be omitted, if desired or necessary. However, when the solar cell includes the anti-reflection layer 133, the passivation layer 131, and the hydrogen injection layer 190 as shown in FIGS. 1 and 2, efficiency of the solar cell may be further improved. Thus, the embodiment of the invention is described using the solar cell including the anti-reflection layer 133, the passivation layer 131, and the hydrogen injection layer 190 as an example.

The semiconductor substrate 110 may be formed of crystalline silicon material containing impurities of a first conductive type. For example, the semiconductor substrate 110 may be formed using a single crystal wafer or a polycrystalline wafer.

The impurities of the first conductive type may be p-type impurities, for example, impurities of a group III element, such as boron (B), gallium (Ga), and indium (In). Alternatively, the impurities of the first conductive type may be n-type impurities, for example, impurities of a group V element, such as phosphorus (P), arsenic (As), and antimony (Sb). The impurities of the first conductive type may be doped on the semiconductor substrate 110. In the following description, the embodiment of the invention is described using an example where the first conductive type is the n-type.

A front surface of the semiconductor substrate 110 may be textured to form a textured surface corresponding to an uneven surface having a plurality of uneven portions or having uneven characteristics, so as to minimize a reflectance of incident light.

When light is incident on the semiconductor substrate 110, electron-hole pairs are produced in the semiconductor substrate 110.

The tunnel layer 160 may be entirely formed on one surface, for example, a back surface of the semiconductor substrate 110. The tunnel layer 160 may pass through carriers produced in the semiconductor substrate 110 and may perform a passivation function with respect to the back surface of the semiconductor substrate 110.

The tunnel layer 160 may be formed of a dielectric material. More specifically, the tunnel layer 160 may be formed of silicon carbide (SiCx) or silicon oxide (SiOx) having strong durability at a high temperature equal to or higher than 600° C. In addition, the tunnel layer 160 may be formed of silicon nitride (SiNx), hydrogenated SiNx, aluminum oxide (AlOx), silicon oxynitride (SiON), or hydrogenated SiON.

Unlike this, if the tunnel layer 160 is formed of a material including amorphous silicon (a-Si), the tunnel layer 160 cannot obtain a desired tunneling effect because amorphous silicon is weak or susceptible to the high temperature equal to or higher than 600° C.

A thickness of the tunnel layer 160 may be 0.5 nm to 2.5 nm.

The emitter region 120 may directly contact the tunnel layer 160 and may be positioned on the entire back surface of the tunnel layer 160.

The emitter region 120 may be formed by doping impurities of a second conductive type opposite the first conductive type on a polycrystalline silicon material layer. For example, the emitter region 120 may be formed of polycrystalline silicon material containing impurities of the second conductive type.

In other words, the emitter region 120 may contain impurities of the second conductive type, for example, p-type impurities. For example, the emitter region 120 may contain impurities of a group III element, such as boron (B), gallium (Ga), and indium (In).

The emitter region 120 may form a p-n junction along with the semiconductor substrate 110 with the tunnel layer 160 interposed therebetween. In another example, if the first conductive type of the semiconductor substrate 110 is the p-type, the emitter region 120 may be of the n-type.

The polycrystalline silicon material layer of the emitter region 120 may be obtained by re-crystallizing an amorphous silicon material layer.

Accordingly, the polycrystalline silicon material of the emitter region 120 may have almost the same crystallinity throughout the emitter region 120. Alternatively, the crystallinity of the polycrystalline silicon material of the emitter region 120 may increase as the emitter region 120 is far away from the tunnel layer 160.

Namely, the crystallinity in a first portion PT1 of the emitter region 120 connected to the second electrode 150 may be relatively high, and the crystallinity in a second portion PT2 of the emitter region 120 closer to the tunnel layer 160 than the first portion PT1 may be relatively low.

Accordingly, a contact resistance between the emitter region 120 and the second electrode 150 may be further improved by the relatively higher crystallinity in the first portion PT1 of the emitter region 120 connected to the second electrode 150.

When the emitter region 120 including the recrystallized polycrystalline silicon material is formed at the back surface of the tunnel layer 160 in a state where the tunnel layer 160 is positioned on the back surface of the semiconductor substrate 110, an open-circuit voltage of the solar cell may be further improved, and a damage of the semiconductor substrate 110 resulting from heat generated in a manufacturing process of the solar cell may be minimized. Hence, the solar cell with high efficiency may be implemented.

A thickness T120 of the emitter region 120 may be 50 nm to 150 nm.

When the thickness T120 of the emitter region 120 is equal to or greater than 50 nm, a function of the emitter region 120 forming the p-n junction along with the semiconductor substrate 110 may be secured. When the thickness T120 of the emitter region 120 is equal to or less than 150 nm, a process time may be minimized through the optimization of the thickness T120 of the emitter region 120 while the function of the emitter region 120 is maintained. Other thicknesses may be used for the emitter region 120.

A doping concentration of the impurities of the second conductive type contained in the emitter region 120 may increase as the emitter region 120 is far away from the tunnel layer 160. Hence, carriers are recombined in the second portion PT2 of the emitter region 120 relatively closer to the semiconductor substrate 110 due to the impurities of the second conductive type, and a loss amount of carriers may be further reduced. As a result, passivation characteristic may be further improved. Further, the contact resistance between the emitter region 120 and the second electrode 150 may be further improved in the first portion PT1 of the emitter region 120 connected to the second electrode 150 due to a relatively higher doping concentration.

Changes in the doping concentration of the emitter region 120 will be separately described in detail with reference to FIG. 3.

The dopant layer 180 is positioned on the emitter region 120 and may contain impurities of the second conductive type. A dielectric material of the dopant layer 180 may include at least one of silicon nitride (SiNx), silicon oxide (SiOx), silicon oxynitride (SiOxNy), silicon carbide (SiCx), or aluminum oxide (AlOx). Thus, the dopant layer 180 may contain SiOx:B containing boron (B) as an example of the impurities of the second conductive type.

The dopant layer 180 functions to diffuse the impurities of the second conductive type contained in the dielectric material into an intrinsic polycrystalline silicon layer in a process for forming the emitter region 120. After the emitter region 120 is formed, the dopant layer 180 receives hydrogen from the hydrogen injection layer 190 formed on a back surface of the dopant layer 180 and may perform a passivation function with respect to the back surface of the emitter region 120.

A thickness of the dopant layer 180 may be 25 nm to 150 nm. When the thickness of the dopant layer 180 is equal to or greater than 25 nm, a minimum amount of impurities of the second conductive type to be diffused into the emitter region 120 may be secured. When the thickness of the dopant layer 180 is equal to or less than 150 nm, the process time may be minimized through the optimization of the thickness of the dopant layer 180 while an amount of impurities of the second conductive type is properly secured. Further, an effusion speed of hydrogen contained in the intrinsic polycrystalline silicon layer for forming the emitter region 120 may be properly controlled in a dehydrogenation process. Other thicknesses may be used for the dopant layer 180.

The hydrogen injection layer 190 positioned on the back surface of the dopant layer 180 may be formed of a dielectric material containing hydrogen at a higher concentration than the dielectric material of the dopant layer 180.

After the formation of the emitter region 120 is completed, the hydrogen injection layer 190 may be formed on the back surface of the dopant layer 180. In an electrode forming operation involving a thermal processing, hydrogen of the high concentration contained in the hydrogen injection layer 190 may be diffused into the dopant layer 180, so that the dopant layer 180 has the passivation function.

The hydrogen injection layer 190 may have a refractive index different from the dopant layer 180, so that light, which is incident on the solar cell and is transmitted by the semiconductor substrate 110, is again incident on the semiconductor substrate 110.

The dielectric material of the hydrogen injection layer 190 may include at least one of SiNx, SiOx, SiOxNy, SiCx, or AlOx.

The front surface field region 170 is positioned at the front surface of the semiconductor substrate 110 and may be more heavily doped than the semiconductor substrate 110 with impurities of the first conductive type.

The front surface field region 170 may be formed by diffusing impurities of the first conductive type into the front surface of the semiconductor substrate 110. Hence, the front surface field region 170 may be formed of the same crystalline silicon material as the semiconductor substrate 110.

For example, when the semiconductor substrate 110 is formed of a single crystal silicon material, the front surface field region 170 may be formed of the single crystal silicon material. Alternatively, when the semiconductor substrate 110 is formed of a polycrystalline silicon material, the front surface field region 170 may be formed of the polycrystalline silicon material.

The passivation layer 131 is positioned directly on a front surface of the front surface field region 170 and may perform a passivation function with respect to the front surface of the front surface field region 170. The passivation layer 131 may be formed of a dielectric material containing hydrogen. For example, the passivation layer 131 may be formed of at least one of SiNx, SiOx, SiOxNy, or AlOx.

The anti-reflection layer 133 is positioned on a front surface of the passivation layer 131. The anti-reflection layer 133 may improve transmission of light incident on the solar cell and reduce a reflectance of the light. Hence, the anti-reflection layer 133 may make a large amount of light be incident on the semiconductor substrate 110.

The anti-reflection layer 133 may be formed of a dielectric material containing hydrogen. For example, the anti-reflection layer 133 may be formed of at least one of SiNx, SiOx, SiOxNy, or AlOx.

The first electrode 140 is positioned on the front surface of the semiconductor substrate 110. The first electrode 140 may pass through the anti-reflection layer 133 and the passivation layer 131 and may be connected to the front surface field region 170.

The first electrode 140 may include a plurality of first finger electrodes 141 and a plurality of first bus bars 142 connected to the plurality of first finger electrodes 141.

The first finger electrodes 141 may be electrically and physically connected to the front surface field region 170. The first finger electrodes 141 may be separated from one another and may extend in parallel with one another in a first direction x. The first finger electrodes 141 may collect carriers (for example, electrons) moving to the front surface field region 170.

The first bus bars 142 may be electrically and physically connected to the emitter region 120 and may extend in parallel with one another in a second direction y crossing the first finger electrodes 141.

The first bus bar 142 may be positioned on the same layer as the first finger electrode 141 and may be electrically and physically connected to the first finger electrode 141 at a location crossing the first finger electrode 141.

As shown in FIG. 1, the plurality of first finger electrodes 141 may have a stripe shape extending in the first direction x, and the plurality of first bus bars 142 may have a stripe shape extending in the second direction y. Hence, the first electrode 140 may have a lattice shape at the front surface of the semiconductor substrate 110.

The plurality of first bus bars 142 may collect not only carrier moving from the front surface field region 170 contacting the first bus bars 142 but also carriers collected by the plurality of first finger electrodes 141.

The first bus bars 142 have to collect carriers collected by the first finger electrodes 141 crossing the first bus bars 142 and have to move the collected carriers in a desired direction. Therefore, a width of each first bus bar 142 may be greater than a width of each first finger electrode 141.

The plurality of first bus bars 142 may be connected to an external device and may output the collected carriers (for example, electrons) to the external device.

The plurality of first finger electrodes 141 and the plurality of first bus bars 142 of the first electrode 140 may be formed of at least one conductive material, for example, silver (Ag).

The second electrode 150 is positioned on the back surface of the semiconductor substrate 110. The second electrode 150 may pass through the dopant layer 180 and the hydrogen injection layer 190 and may be connected to the emitter region 120.

As shown in FIGS. 1 and 2, the second electrode 150 may include a plurality of second finger electrodes 151 and a plurality of second bus bars 152 connected to the plurality of second finger electrodes 151 in the same manner as the first electrode 140. The second electrode 150 may have the same pattern as the first electrode 140. Other patterns may be used for the second electrode 150.

The second electrode 150 may collect carriers (for example, holes) moving to the emitter region 120.

FIGS. 1 and 2 show that the emitter region 120 is positioned on the back surface of the semiconductor substrate 110 and the front surface field region 170 is positioned on the front surface of the semiconductor substrate 110, as an example. In another example, the emitter region 120 may be positioned on the front surface of the semiconductor substrate 110, and the front surface field region 170 may be positioned on the back surface of the semiconductor substrate 110. The another example may be equally applied to the embodiment of the invention.

In the solar cell according to the embodiment of the invention, the doping concentration of the impurities of the second conductive type contained in the emitter region 120 may entirely increase as the emitter region 120 is far away from the tunnel layer 160.

This is described in detail below with reference to FIG. 3.

Figure 3:
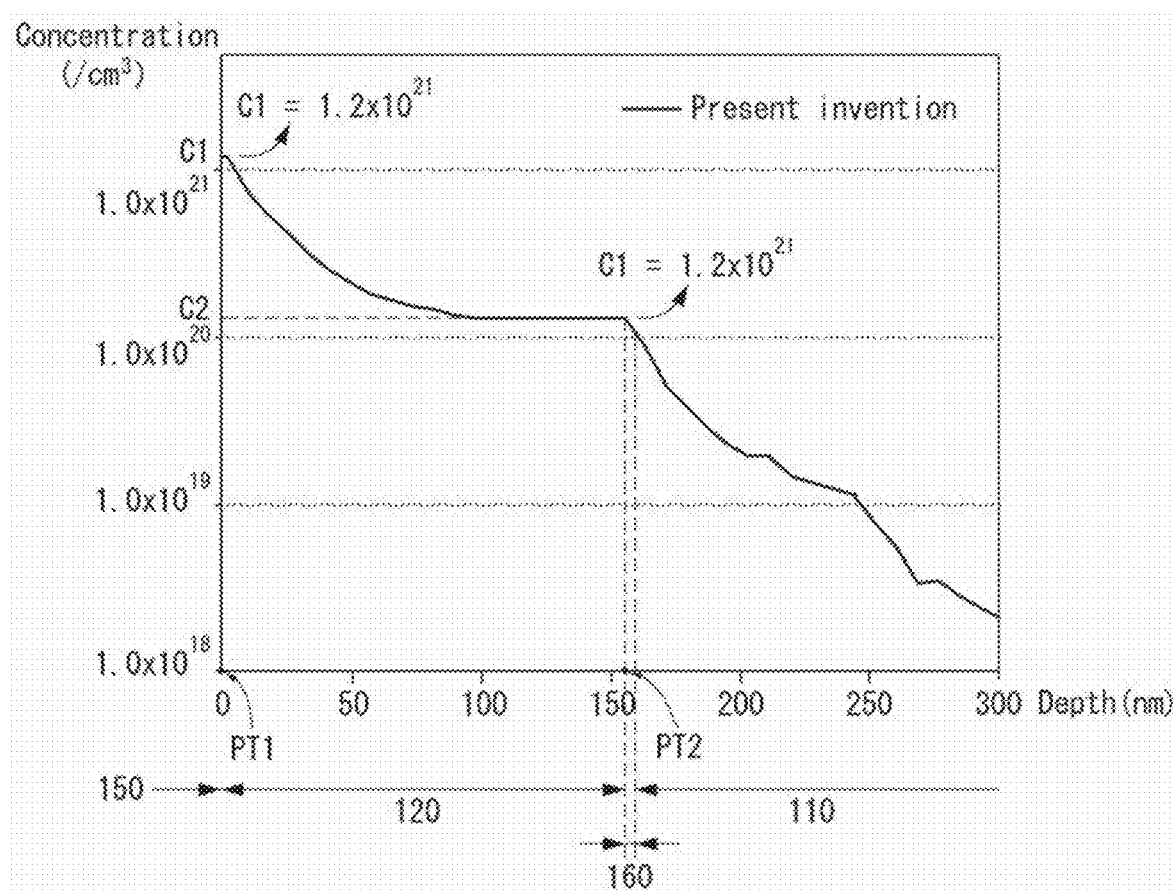
FIG. 3 illustrates a doping concentration of an emitter region of the solar cell shown in FIG. 1.
Figure 4:
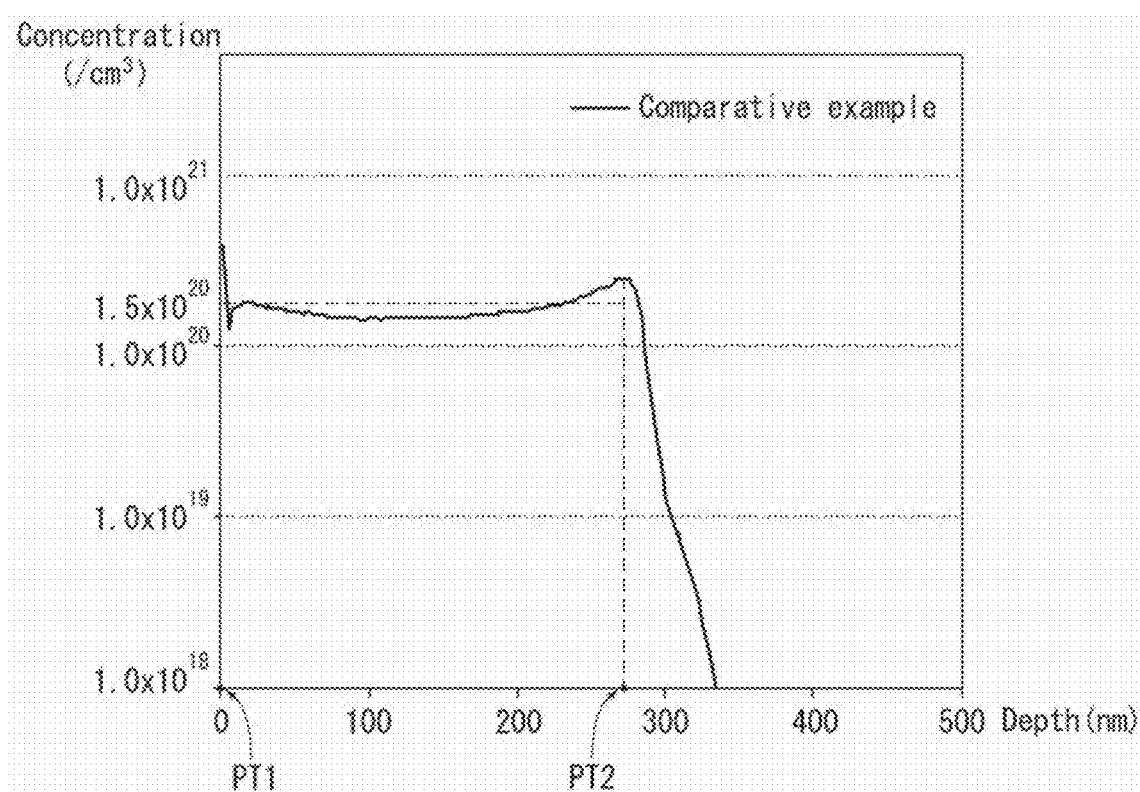
FIG. 4 illustrates a doping concentration of an emitter region according to a comparative example different from an example embodiment of the invention.

FIG. 3 illustrates a doping concentration of the emitter region of the solar cell shown in FIG. 1. FIG. 4 illustrates a doping concentration of an emitter region according to a comparative example different from the embodiment of the invention.

More specifically, FIGS. 3 and 4 show an example of a doping concentration depending on the cross-section of the emitter region 120 and the semiconductor substrate 110. In FIGS. 3 and 4, x-axis denotes a depth toward the semiconductor substrate 110 from the back surface of the emitter region 120 contacting the second electrode 150, and y-axis denotes a doping concentration.

FIG. 3 shows an example of the doping concentration when the thickness T120 of the emitter region 120 is about 150 nm, for example. However, the thickness T120 of the emitter region 120 may be variously determined between 50 nm and 150 nm. Further, the doping concentration shown in FIG. 3 is merely an example and thus may be variously changed.

As shown in FIG. 3, the doping concentration of the emitter region 120 according to the embodiment of the invention may be higher than a doping concentration of the semiconductor substrate 110.

A first doping concentration C1 of second conductive type impurities in the first portion PT1 (at a depth of 0 nm) of the emitter region 120 contacting the second electrode 150 may be higher than a second doping concentration C2 of second conductive type impurities in the second portion PT2 (at a depth of 150 nm) of the emitter region 120 contacting the tunnel layer 160.

The first portion PT1 indicates a contact portion of the emitter region 120 and the second electrode 150 or a contact portion of the emitter region 120 and the dopant layer 180. The second portion PT2 indicates a contact portion of the emitter region 120 and the tunnel layer 160.

In FIG. 3, for example, the first doping concentration C1 is $1.2*10^{21}/cm^3$, and the second doping concentration C2 is $1.3*10^{20}/cm^3$. However, the first doping concentration C1 may be determined between $5*10^{19}/cm^3$ and $5*10^{21}/cm^3$, and the second doping concentration C2 may be determined between $5*10^{18}/cm^3$ and $5*10^{20}/cm^3$ and may be lower than the first doping concentration C1.

The doping concentration of the emitter region 120 may increase as the emitter region 120 is far away from the tunnel layer 160. More specifically, as the emitter region 120 goes from the first portion PT1 to the second portion PT2, the doping concentration of the emitter region 120 may successively decrease linearly or nonlinearly.

In FIG. 3, for example, as the emitter region 120 goes from the first portion PT1 to the second portion PT2, the doping concentration of the emitter region 120 successively and nonlinearly decreases from the first doping concentration C1 to the second doping concentration C2. However, the doping concentration of the emitter region 120 may successively and linearly decrease.

The characteristic of the emitter region 120, in which the doping concentration of the emitter region 120 increases as the emitter region 120 is far away from the tunnel layer 160, may be generated in a thermal processing operation of diffusing the second conductive type impurities of the dopant layer 180 into a polycrystalline silicon layer recrystallized through a process for recrystallizing an intrinsic amorphous silicon layer into a polycrystalline silicon layer by performing one successive thermal process, of which the temperature changes, in a state where an intrinsic amorphous silicon layer is firstly formed. Hence, the emitter region 120 is formed.

In the second portion PT2 of the emitter region 120 relatively close to the semiconductor substrate 110, carriers may be recombined by impurities, and a loss amount of carriers may be further reduced due to the above characteristic of the emitter region 120, in which the doping concentration of the emitter region 120 increases as the emitter region 120 is far away from the tunnel layer 160. Hence, the passivation characteristic may be further improved. In the first portion PT1 of the emitter region 120 connected to the second electrode 150, the contact resistance between the emitter region 120 and the second electrode 150 may be further improved due to the relatively higher doping concentration of the emitter region 120.

Unlike the embodiment of the invention shown in FIG. 3, in the comparative example of FIG. 4, when impurities of the second conductive type are diffused in a state an intrinsic polycrystalline silicon layer is deposited and formed, a doping concentration of the emitter region 120 does not entirely increase as the emitter region 120 goes from the first portion PT1 to the second portion PT2. In this instance, the doping concentration of the emitter region 120 slightly changes, but is entirely uniform around $1.5*10^{20}/cm^3$.

It may be difficult for the comparative example of FIG. 4 to secure the same effect as the embodiment of the invention. Namely, when the comparative example increases the doping concentration so as to improve the contact characteristic between the emitter region 120 and the second electrode 150, an amount of carriers recombined in the emitter region 120 may increase because the doping concentration of the emitter region 120 itself entirely increases. Hence, the characteristic of the emitter region 120 may be reduced. When the comparative example decreases the doping concentration so as to improve the characteristic of the emitter region 120, the contact resistance between the emitter region 120 and the second electrode 150 may increase. Hence, characteristic of a short circuit current of the solar cell may be reduced.

So far, the embodiment of the invention described an example of the structure of the solar cell. Hereinafter, the embodiment of the invention will describe an example of a method for manufacturing the solar cell.

Figure 5:
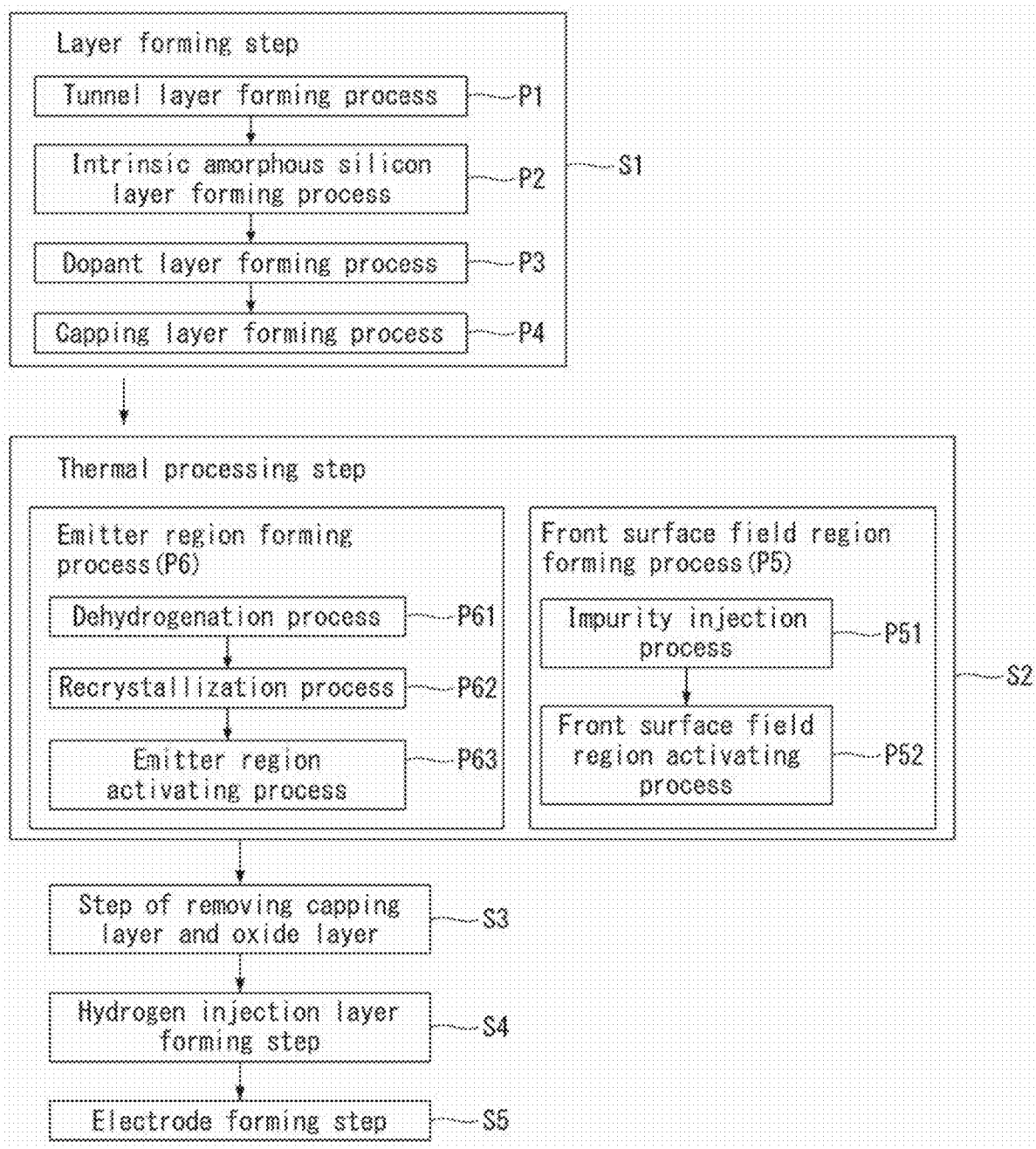
FIG. 5 is a flow chart illustrating a method for manufacturing a solar cell according to an example embodiment of the invention.

FIG. 5 is a flow chart illustrating a method for manufacturing the solar cell according to the embodiment of the invention. FIGS. 6A to 6E depicts reference figures of each stage illustrated in the flow chart of FIG. 5.

As shown in FIG. 5, the method for manufacturing the solar cell according to the embodiment of the invention may include a layer forming operation S1, a thermal processing operation S2, an operation S3 of removing a capping layer and an oxide layer, a hydrogen injection layer forming operation S4, and an electrode forming operation S5.

The operation S3 for removing a capping layer and an oxide layer and the hydrogen injection layer formation operation S4 may be omitted, if necessary or desired. However, when the method for manufacturing the solar cell includes the operations S3 and S4, the efficiency of the solar cell thus manufactured may be further improved. Thus, the embodiment of the invention is described using the method for manufacturing the solar cell including the operations S3 and S4 as an example.

As shown in FIG. 5, in the layer forming operation S1, a tunnel layer forming process P1, an intrinsic amorphous silicon layer forming process P2, a dopant layer forming process P3, and a capping layer forming process P4 may be performed.

Figure 6A:
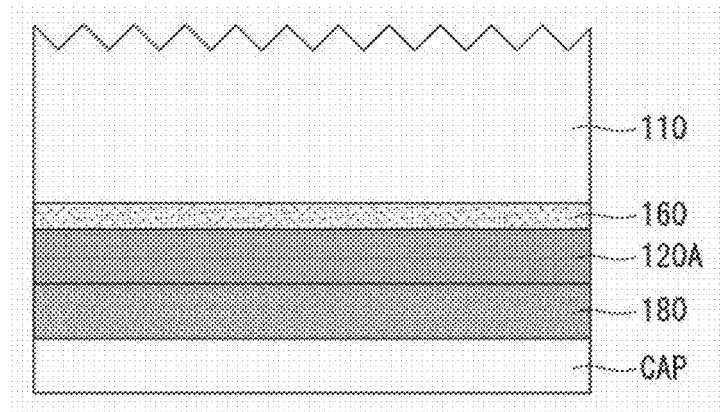
FIGS. 6A to 6E depicts reference figures of each stage illustrated in the flow chart of FIG. 5.

More specifically, referring to FIG. 6A, in the tunnel layer forming process P1, SiCx or SiOx may be deposited on the back surface of the semiconductor substrate 110 formed of crystalline silicon material containing impurities of the first conductive type to form the tunnel layer 160 on the entire back surface of the semiconductor substrate 110.

Next, in the intrinsic amorphous silicon layer forming process P2, an intrinsic amorphous silicon layer 120A may be formed on the entire back surface of the tunnel layer 160 through the deposition. In this instance, a thickness of the intrinsic amorphous silicon layer 120A may be determined between 50 nm and 150 nm.

Next, in the dopant layer forming process P3, the dopant layer 180 formed of a dielectric material containing impurities of the second conductive type, for example, boron (B) may be formed on an entire back surface of the intrinsic amorphous silicon layer 120A. In this instance, a thickness of the dopant layer 180 may be determined between 25 nm and 150 nm.

Next, a capping layer CAP formed of a dielectric material not containing impurities of the second conductive type may be formed on the entire back surface of the dopant layer 180. The dielectric material forming the capping layer CAP may be at least one of SiOx, SiNx, SiOxNy, or SiCx not containing impurities of the second conductive type. For example, it may be more advantageous in the manufacturing process that the capping layer CAP is formed of SiOx so as to easily perform the subsequent operation S3 of removing the capping layer and the oxide layer.

In a front surface field region forming process P5 of the subsequent thermal processing operation S2, the capping layer CAP may prevent impurities of the first conductive type from being diffused into the intrinsic amorphous silicon layer 120A. When a dehydrogenation process P61 of the subsequent thermal processing operation S2 is performed, the capping layer CAP may control an amount and a speed of hydrogen emitted from the intrinsic amorphous silicon layer 120A.

In this instance, a sum of a thickness of the capping layer CAP and the thickness of the dopant layer 180 may be determined between 50 nm and 150 nm.

Thus, when the thickness of the dopant layer 180 is 150 nm, the capping layer forming process P4 may be omitted.

The tunnel layer forming process P1, the intrinsic amorphous silicon layer forming process P2, the dopant layer forming process P3, and the capping layer forming process P4 of the layer forming operation S1 may be performed in-situ.

Namely, the processes P1 to P4 of the layer forming operation S1 may be successively performed while moving in a vacuum state between chambers, in which each of the processes P1 to P4 is performed in a vacuum state without being exposed in an atmosphere between the processes P1 to P4. Hence, the process time may be further reduced.

It is preferable, but not required, that the layer forming operation S1 may be performed using a plasma enhanced chemical vapor deposition (PECVD) method performed at a temperature equal to or lower than 300° C. Alternatively, an atmospheric pressure chemical vapor deposition (APCVD) method or a low pressure chemical vapor deposition (LPCVD) method may be used.

After the layer forming operation S1 is performed, the thermal processing operation S2 may be performed.

The thermal processing operation S2 may be performed in a furnace through one successive thermal process, so as to form the front surface field region 170 and the emitter region 120.

The one successive thermal process, of which a temperature is maintained or raised, is to successively provide a thermal process, of which a temperature is maintained or raised without a fall in the temperature during a period of the thermal processing operation S2. When the temperature falls, one cycle of one thermal processing operation S2 is completed. The thermal process for maintaining or raising the temperature may be performed several times.

Accordingly, the thermal processing operation S2 according to the embodiment of the invention forms the front surface field region 170 and the emitter region 120 through only the one successive thermal process, in which the temperature does not fall and is maintained or raised, in one furnace. Hence, manufacturing time may be further reduced.

The successive thermal process, of which the temperature is maintained or raised, is described in detail later with reference to FIG. 7.

In the thermal processing operation S2, the front surface field region forming process P5 for forming the front surface field region 170 on the front surface of the semiconductor substrate 110 and an emitter region forming process P6 for recrystallizing the intrinsic amorphous silicon layer 120A into an intrinsic polycrystalline silicon layer 120C and diffusing impurities of the second conductive type of the dopant layer 180 into the recrystallized intrinsic polycrystalline silicon layer 120C to form the emitter region 120 may be performed together.

The front surface field region forming process P5 may include an impurity injection process P51 and a front surface field region activating process P52.

Figure 6B:
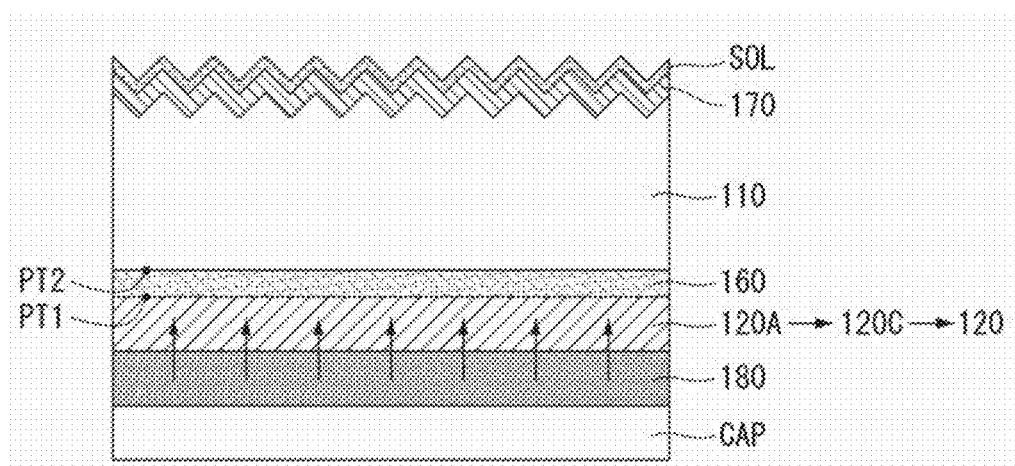

In the impurity injection process P51, POCl₃ gas containing impurities of the first conductive type may be injected into the furnace. In the front surface field region activating process P52, as shown in FIG. 6B, phosphorus (P) corresponding to impurities of the first conductive type in the POCl₃ gas may be diffused into the front surface of the semiconductor substrate 110 and activated.

In this instance, phosphorus (P) of the POCl₃ gas may be prevented from being diffused into the intrinsic amorphous silicon layer 120A or the intrinsic polycrystalline silicon layer 120C by the capping layer CAP and the dopant layer 180 on the back surface of the semiconductor substrate 110.

The front surface field region activating process P52 may be performed through a thermal process of 800° C. to 1000° C.

An oxide layer SOL may be unnecessarily formed on the front surface of the front surface field region 170 in the front surface field region activating process P52. The oxide layer SOL may be removed together when the capping layer CAP is removed later.

The embodiment of the invention described that the front surface field region forming process P5 of the thermal processing operation S2 in the flow chart shown in FIG. 5 includes the impurity injection process P51 for injecting the $POCl_3$ gas containing impurities of the first conductive type into the furnace, as an example. However, a dopant source may be formed.

Namely, the front surface field region forming process P5 may apply a dopant paste containing impurities of the first conductive type or form the dopant paste on the front surface of the semiconductor substrate 110 in a SOD (spin on dopant) method instead of performing the impurity injection process P51 before the thermal processing operation S2 after the layer forming operation S1, and then may diffuse and activate the impurities of the first conductive type into the front surface of the semiconductor substrate 110 in the front surface field region activating process P52 of the thermal processing operation S2.

Alternatively, the front surface field region forming process P5 may previously implant the dopant paste formed on the front surface of the semiconductor substrate 110 onto the front surface of the semiconductor substrate 110 using a laser irradiation device before the thermal processing operation S2 after the layer forming operation S1, and then may perform the front surface field region activating process P52.

Next, the emitter region forming process P6 may include the dehydrogenation process P61, a recrystallization process P62, and an emitter region activating process P63.

The dehydrogenation process P61 is a thermal process for removing hydrogen contained in the intrinsic amorphous silicon layer 120A. In other words, the dehydrogenation process P61 diffuses hydrogen contained in the intrinsic amorphous silicon layer 120A by increasing a temperature of the furnace and discharges hydrogen to the outside of the intrinsic amorphous silicon layer 120A through the dopant layer 180 and the capping layer CAP.

When an amount or a speed of discharging of the hydrogen contained in the intrinsic amorphous silicon layer 120A is excessively large, the intrinsic amorphous silicon layer 120A may be damaged. On the contrary, when the amount or the speed is small, the manufacturing time may increase. It is preferable, but not required, that the temperature in the furnace is optimized so as to optimize the amount or the speed of the discharging of the hydrogen.

In this instance, the temperature in the furnace may be controlled between 350° C. and 600° C., for example.

The recrystallization process P62 is a process for recrystallizing the intrinsic amorphous silicon layer 120A into the intrinsic polycrystalline silicon layer 120C. The recrystallization process P62 may be performed by further increasing the temperature of the furnace when the dehydrogenation process P61 is almost completed. In the recrystallization process P62, the intrinsic amorphous silicon layer 120A may start to be recrystallized between about 600° C. and 650° C.

Thus, the recrystallization process P62 may be performed at a temperature higher than the dehydrogenation process P61 and may be successively performed subsequent to the dehydrogenation process P61. The recrystallization process P62 may be performed by increasing the temperature of the furnace by about 800° C. to 1000° C. from a temperature of the dehydrogenation process P61.

Through the recrystallization process P62, the crystallization of the intrinsic amorphous silicon layer 120A may start from the first portion PT1 contacting the dopant layer 180 and may be proceeded toward the second portion PT2 contacting the tunnel layer 160.

Thus, the crystallinity of the first portion PT1 may be higher than the crystallinity of the second portion PT2. Further, as the emitter region 120 goes from the first portion PT1 to the second portion PT2, the crystallinity may gradually decrease. However, a reduction pattern of the crystallinity may be differently formed depending on time and the temperature of the recrystallization process P62.

The emitter region activating process P63 is a process for diffusing and activating impurities of the second conductive type contained in the dopant layer 180 shown in FIG. 6B into the recrystallized intrinsic polycrystalline silicon layer 120C. The emitter region activating process P63 may be performed by maintaining a maximum temperature of the recrystallization process P62.

Namely, the emitter region activating process P63 may be performed by maintaining the temperature of the furnace at 800° C. to 1000° C.

The emitter region 120, in which impurities of the second conductive type are doped on the intrinsic polycrystalline silicon layer 120C through the emitter region activating process P63, may be completed.

During the emitter region activating process P63, the recrystallization process P62 may be continuously performed. Because impurities of the second conductive type are diffused from the first portion PT1 contacting the dopant layer 180 toward the second portion PT2 contacting the tunnel layer 160, the first doping concentration C1 of the first portion PT1 may be higher than the second doping concentration C2 of the second portion PT2. The doping concentration of the second conductive type impurities may successively decrease as the emitter region 120 goes from the first portion PT1 to the second portion PT2.

As described above, the thermal processing operation S2 for simultaneously forming the emitter region 120 and the front surface field region 170 may be performed through one successive thermal process, of which the temperature is maintained or raised. The one successive thermal process, of which the temperature is maintained or raised, may greatly reduce the manufacturing time of the solar cell and may improve the efficiency of the solar cell.

As shown in FIG. 5, after the thermal processing operation S2 is completed, the operation S3 of removing the capping layer and the oxide layer and the hydrogen injection layer forming operation S4 may be performed before the electrode forming operation S5. However, the above operations are not necessary, and some of the above operations may be omitted.

Figure 6C:
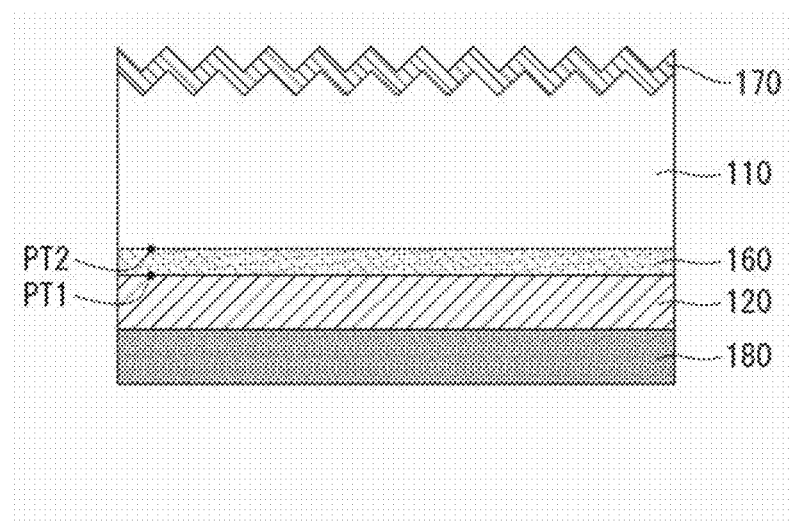

In the operation S3 of removing the capping layer and the oxide layer, as shown in FIG. 6C, the capping layer CAP formed on the back surface of the semiconductor substrate 110 and the oxide layer SOL formed on the front surface of the semiconductor substrate 110 in the thermal processing operation S2 may be removed using a general etchant removing the oxide layer SOL.

In the embodiment disclosed herein, when the capping layer CAP is formed of, for example, SiOx, the operation S3 of removing the capping layer and the oxide layer may be more easily performed using the same etchant as the etchant removing the oxide layer SOL.

If the capping layer CAP is omitted in the layer forming operation S1, the operation of removing the capping layer CAP may be omitted.

Figure 6D:
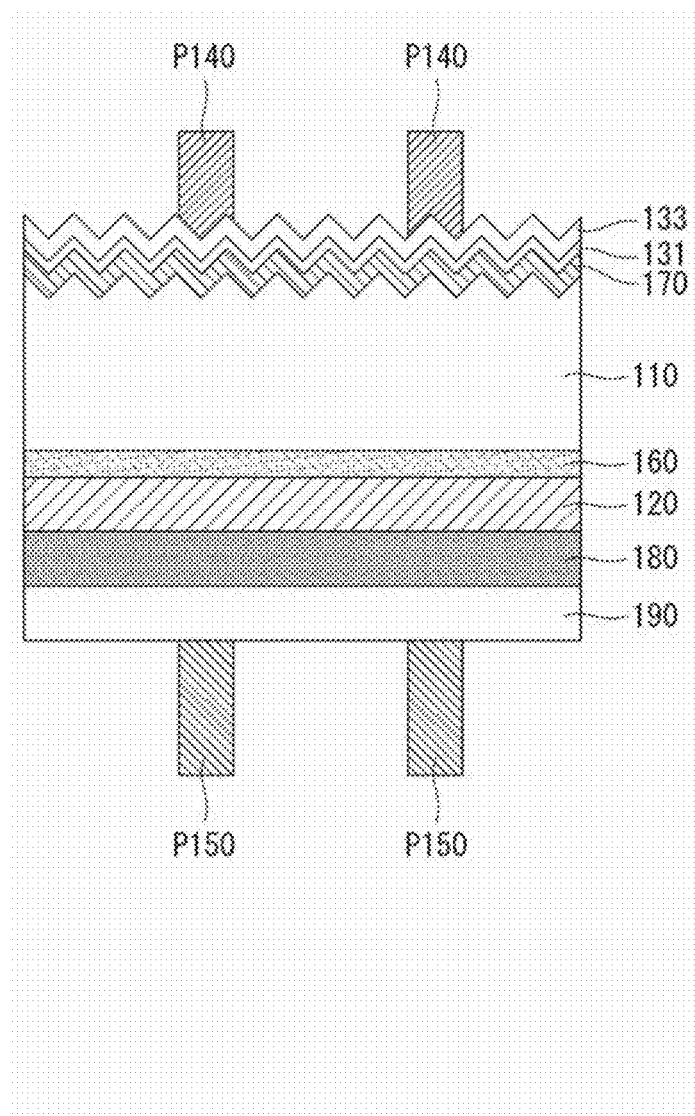

Next, in the hydrogen injection layer forming operation S4, as shown in FIG. 6D, the hydrogen injection layer 190 which is formed of the dielectric material containing hydrogen at the high concentration, may be formed on the back surface of the dopant layer 180, on which the capping layer CAP is removed.

Because the hydrogen injection layer 190 contains hydrogen at the high concentration, the passivation function of the dopant layer 180 and the tunnel layer 160 may be improved by supplying hydrogen to the dopant layer 180 and the tunnel layer 160 in the subsequent electrode forming operation S5.

In this instance, a hydrogen concentration of the hydrogen injection layer 190 may be equal to or higher than a hydrogen concentration of the dopant layer 180, to which hydrogen is supplied.

Further, as shown in FIG. 6D, a first electrode paste P140 for forming the first electrode 140 and a second electrode paste P150 for forming the second electrode 150 may be respectively patterned and applied on the front surface and the back surface of the semiconductor substrate 110 in a state where the passivation layer 131 and the anti-reflection layer 133 are formed on the front surface of the front surface field region 170.

Figure 6E:
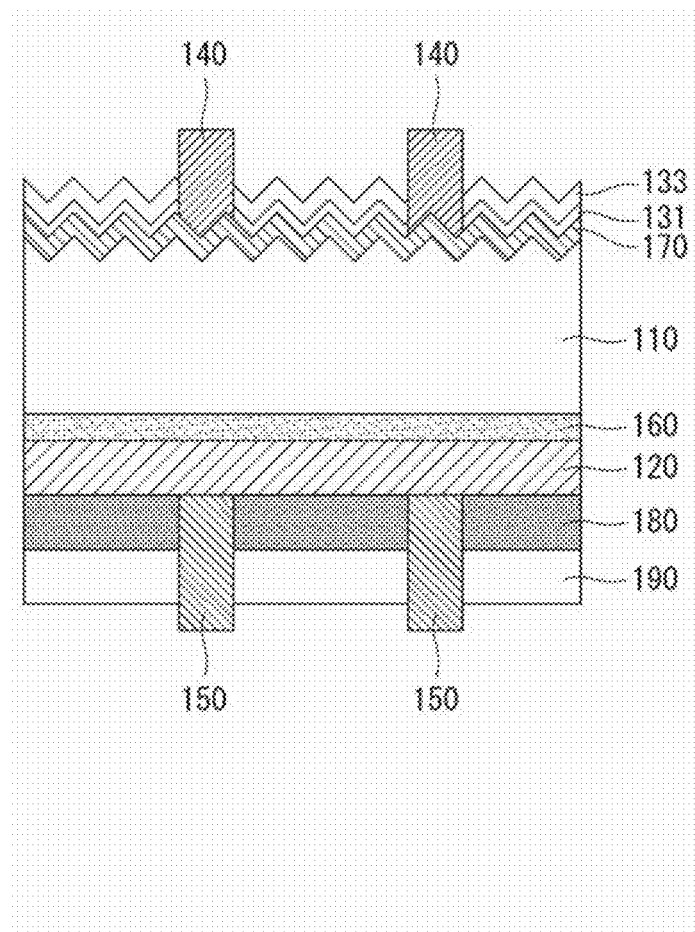

Next, as shown in FIGS. 5 and 6E, in the electrode forming operation S5, the first electrode paste P140 may pass through the passivation layer 131 and the anti-reflection layer 133 through the thermal processing of the semiconductor substrate 110 to form the first electrode 140 connected to the front surface of the semiconductor substrate 110. Further, the second electrode paste P150 may pass through the hydrogen injection layer 190 and the dopant layer 180 through the thermal processing of the semiconductor substrate 110 to form the second electrode 150 connected to the emitter region 120.

The embodiment of the invention mainly described the method forming each of the components of the solar cell so as to describe the method for manufacturing the solar cell. Hereinafter, one successive thermal process, of which the temperature of the thermal processing operation S2 is maintained or raised, is described in detail.

Figure 7:
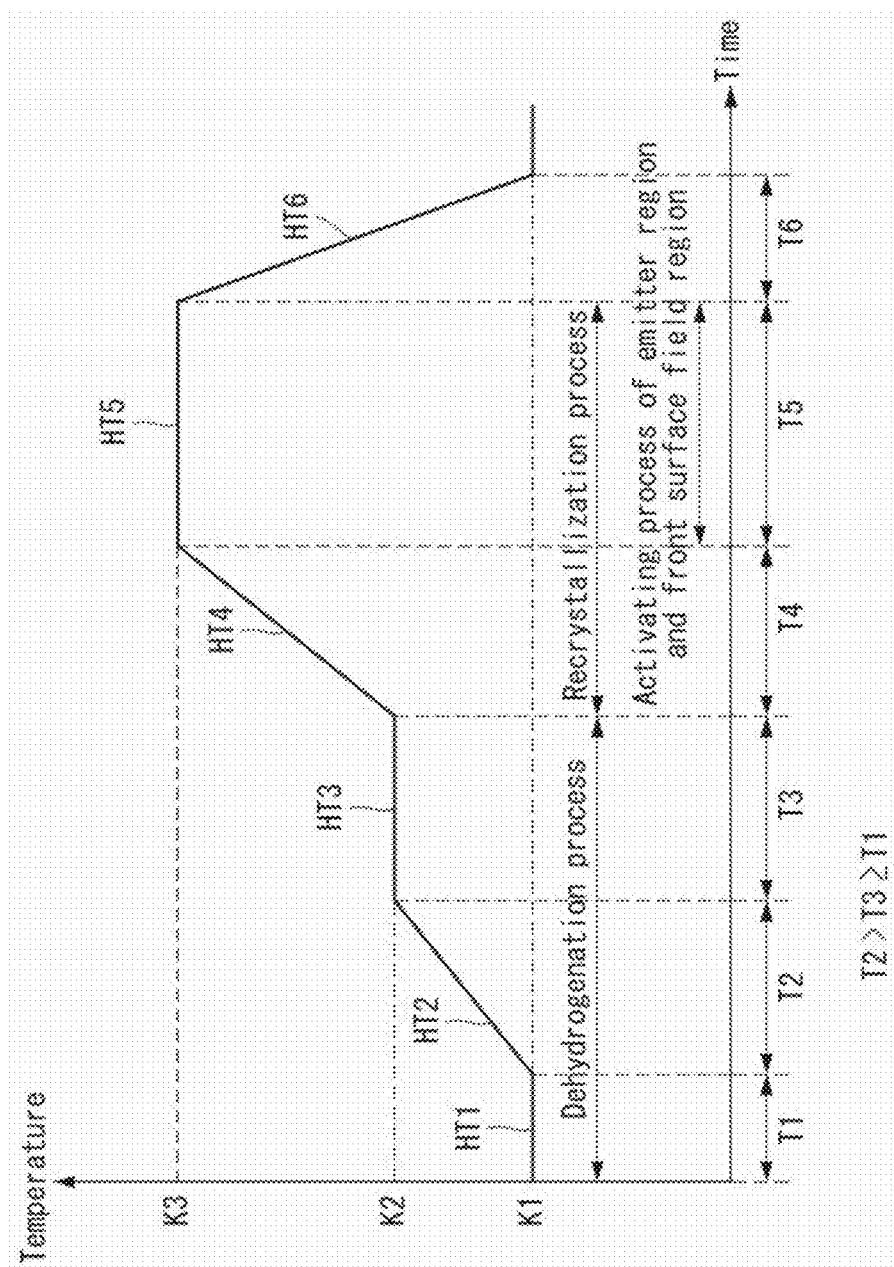
FIG. 7 illustrates changes in a temperature over time in a thermal processing operation of a method for manufacturing a solar cell according to an example embodiment of the invention.

FIG. 7 illustrates changes in a temperature over time in the thermal processing operation S2 of the method for manufacturing the solar cell according to the embodiment of the invention.

As shown in FIG. 7, a plurality of thermal processes may constitute one thermal processing operation S2. Namely, the plurality of thermal processes may form one cycle of the thermal processing operation S2.

The thermal processing operation S2 according to the embodiment of the invention may include first to sixth thermal processes HT1 to HT6. More specifically, as shown in FIG. 7, the temperature of the thermal processing operation S2 does not fall and is maintained or raised in the first to fifth thermal processes HT1 to HT5 and falls in the sixth thermal process HT6. Hence, one successive thermal operation S2, of which the temperature changes, may be performed.

The first to sixth thermal processes HT1 to HT6 may be successively performed in the same furnace.

More specifically, as shown in FIG. 7, a temperature of the furnace in the first thermal process HT1 may be maintained at a first temperature K1, and the temperature of the furnace in the second thermal process HT2 may increase from the first temperature K1 to a second temperature K2 higher than the first temperature K1. The temperature of the furnace in the third thermal process HT3 may be maintained at the second temperature K2.

The dehydrogenation process P61 of the intrinsic semiconductor layer may be performed in the first to third thermal processes HT1 to HT3.

In the embodiment disclosed herein, a second thermal process time T2 of the second thermal process HT2 may be longer than a first thermal process time T1 of the first thermal process HT1 and a third thermal process time T3 of the third thermal process HT3, and the third thermal process time T3 may be equal to or longer than the first thermal process time T1.

More specifically, as shown in FIG. 7, the first thermal process HT1 may maintain the temperature of the furnace at the first temperature K1 of 350° C. to 450° C. for the first thermal process time T1 of 5 minutes to 15 minutes. The third thermal process HT3 may maintain the temperature of the furnace at the second temperature K2 of 500° C. to 600° C. for the third thermal process time T3 of 10 minutes to 20 minutes, which is equal to or longer than the first thermal process time T1.

The second thermal process HT2 may increase the temperature of the furnace from the first temperature K1 to the second temperature K2 for the second thermal process time T2 of 15 minutes to 25 minutes, which is longer than the first thermal process time T1 and the third thermal process time T3.

The dehydrogenation process P61 of the intrinsic amorphous silicon layer 120A may be optimally performed depending on the temperature and the process time of the first to third thermal processes HT1 to HT3.

The fourth thermal process HT4 may increase the temperature of the furnace from the second temperature K2 to a third temperature K3 of 800° C. to 1000° C. higher than the second temperature K2 for a fourth thermal process time T4 of 5 minutes to 15 minutes.

The intrinsic amorphous silicon layer 120A may be recrystallized through the fourth thermal process HT4 and may be changed into the intrinsic polycrystalline silicon layer 120C.

The fifth thermal process HT5 may maintain the temperature of the furnace at the third temperature K3 of 800° C. to 1000° C. for a fifth thermal process time T5 of 15 minutes to 30 minutes, thereby diffusing and activating boron (B) corresponding to the second conductive type impurities of the dopant layer 180 into the recrystallized intrinsic polycrystalline silicon layer 120C. Hence, the emitter region 120 may be formed. Further, phosphorus (P) corresponding to the first conductive type impurities of $POCl_3$ gas injected into the furnace may be diffused and activated into the front surface of the semiconductor substrate 110 to form the front surface field region 170.

Namely, the recrystallization process P62 and the emitter region activating process P63 may be continuously performed together in the fifth thermal process HT5.

As described above, the method for manufacturing the solar cell according to the embodiment of the invention may simultaneously perform the emitter region activating process P63 and the front surface field region activating process P52 through the fifth thermal process HT5.

Next, the sixth thermal process HT6 may reduce the temperature of the furnace from the third temperature K3 to the first temperature K1 for a sixth thermal process time T6.

Hence, one thermal processing operation S2 may be completed. The sixth thermal process time T6 is not particularly limited.

The method for manufacturing the solar cell according to the embodiment of the invention may diffuse and activate the first conductive type impurities and the second conductive type impurities through only one thermal process of the high temperature, unlike the general manufacturing method using at least two thermal processes performed at a high temperature equal to or higher than 800° C. Hence, a degradation of the semiconductor substrate 110 may be prevented, and an open-circuit voltage and the efficiency of the solar cell may be further improved.

The embodiment of the invention may diffuse and activate the second conductive type impurities at the same time as the recrystallization of the intrinsic amorphous silicon layer 120A into the intrinsic polycrystalline silicon layer 120C. Thus, the doping concentration of the emitter region 120 may increase as the emitter region 120 is far away from the tunnel layer 160.

Accordingly, the embodiment of the invention may further simplify the manufacturing process of the solar cell and may further improve the efficiency of the solar cell.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a semiconductor substrate containing impurities of a first conductive type;
a tunnel layer positioned on the semiconductor substrate;
an emitter region positioned on the tunnel layer and containing impurities of a second conductive type opposite the first conductive type;
a dopant layer positioned on the emitter region and formed of a dielectric material containing impurities of the second conductive type;
a hydrogen injection layer positioned on a back surface of the dopant layer and formed of a dielectric material containing hydrogen at a higher concentration than that of the dopant layer;
a first electrode connected to the semiconductor substrate, and including a plurality of first finger electrodes and a plurality of first bus bars crossing the plurality of first finger electrodes; and
a second electrode configured to pass through both the hydrogen injection layer and the dopant layer, and connected to the emitter region, and including a plurality of second finger electrodes and a plurality of second bus bars crossing the plurality of second finger electrodes,
wherein a doping concentration of the second conductive type impurities contained in the emitter region and a crystallinity of the emitter region increase in the emitter region going away from the tunnel layer.

2. The solar cell of claim 1, wherein a first doping concentration of the second conductive type impurities in a first portion of the emitter region contacting the second electrode is $5*10^{19}/cm^3$ to $5*10^{21}/cm^3$, and
wherein a second doping concentration of the second conductive type impurities in a second portion of the emitter region contacting the tunnel layer is lower than the first doping concentration, and is $5*10^{18}/cm^3$ to $5*10^{20}/cm^3$.

3. The solar cell of claim 1, wherein a doping concentration of the emitter region successively decreases linearly or nonlinearly in the emitter region going from a first portion of the emitter region contacting the second electrode to a second portion of the emitter region contacting the tunnel layer.

4. The solar cell of claim 1, wherein a thickness of the emitter region is 50 nm to 150 nm, and
wherein a thickness of the dopant layer is 25 nm to 150 nm.

5. The solar cell of claim 1, further comprising a front surface field region positioned on a front surface of the semiconductor substrate and containing impurities of the first conductive type at a higher concentration than that of the semiconductor substrate,
wherein the tunnel layer, the emitter region, and the dopant layer are positioned on a back surface of the semiconductor substrate.

* * * * *